US008236646B2

(12) United States Patent
Chan et al.

(10) Patent No.: US 8,236,646 B2
(45) Date of Patent: Aug. 7, 2012

(54) NON-VOLATILE MEMORY MANUFACTURING METHOD USING STI TRENCH IMPLANTATION

(75) Inventors: Tze Ho Simon Chan, Singapore (SG); Weining Li, Shanghai (CN); Elgin Quek, Singapore (SG); Jia Zhen Zheng, Singapore (SG); Pradeep Ramachandramurthy Yelehanka, Singapore (SG); Tommy Lai, Kowloon (HK)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 1241 days.

(21) Appl. No.: 10/703,289

(22) Filed: Nov. 6, 2003

(65) Prior Publication Data
US 2005/0101102 A1    May 12, 2005

(51) Int. Cl.
H01L 21/336    (2006.01)
(52) U.S. Cl. . 438/257; 438/262; 257/316; 257/E21.422; 257/E21.551; 257/E21.209

(58) Field of Classification Search .................. 438/201, 438/211, 257, 262, 424, 700; 257/314–317, 257/E21.422, E21.551, E21.209
See application file for complete search history.

(56) References Cited

U.S. PATENT DOCUMENTS

| 5,278,438 | A * | 1/1994 | Kim et al. ............. 257/316 |
| 5,786,262 | A * | 7/1998 | Jang et al. ............ 438/424 |
| 6,268,248 | B1 * | 7/2001 | Mehrad .............. 438/262 |
| 6,566,200 | B2 * | 5/2003 | Mehrad et al. ......... 438/262 |
| 6,635,532 | B2 * | 10/2003 | Song et al. ............ 438/259 |

* cited by examiner

Primary Examiner — David Vu

(57) ABSTRACT

A method for manufacturing an integrated circuit structure includes providing a semiconductor substrate and forming two trenches in the semiconductor substrate to define an active region therebetween. An implanted source region is formed in one of the trenches on one side of the active region. An implanted drain region is formed in the other trench on the other side of the active region. Shallow trench isolations are then formed in the trenches. One or more gates are formed over the active region, and contacts to the implanted source region and the implanted drain region are formed.

10 Claims, 4 Drawing Sheets

NON-VOLATILE MEMORY MANUFACTURING METHOD USING STI TRENCH IMPLANTATION

TECHNICAL FIELD

The present invention relates generally to semiconductor devices and methods for the manufacturing thereof, and more specifically to non-volatile memories.

BACKGROUND ART

Electronic equipment, such as televisions, telephones, radios, and computers, is constructed using semiconductor microprocessors, integrated circuits, memory chips, and the like. These semiconductor components are typically fabricated on a semiconductor substrate and are constructed using various microelectronic devices such as transistors, capacitors, diodes, resistors, and so forth. Each microelectronic device is typically a pattern of conductor, semiconductor, and insulator regions formed on the semiconductor substrate.

Conventional semiconductor memory devices fall into two general classes: volatile memories and non-volatile memories. Volatile memories are generally faster and less expensive, but lose (or "forget") their data when the power is turned off. Non-volatile memories, while slower and more expensive to fabricate, have the advantage that they retain their data even during long periods when no power is available. Non-volatile semiconductor memory devices include read-only-memory ("ROM") devices, programmable-read-only-memory ("PROM") devices, erasable-programmable-read-only-memory ("EPROM") devices and electrically-erasable-programmable-read-only-memory ("EEPROM") devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Flash memory is formed from an array of memory cells. Data can be written to each cell within the array, but, as indicated, the data is erased in blocks of cells. Each cell is a floating gate transistor having a source, a drain, a floating gate, and a control gate. The floating gate and the control gate are typically fabricated from polycrystalline silicon doped with an appropriate doping material (e.g., phosphorous) to make the polycrystalline silicon conductive. The floating gate is isolated electrically, and is separated from a substrate region by a gate dielectric or tunnel dielectric layer of insulating material. The floating gate and control gate are typically separated from each other by a layer of insulating material. The substrate region includes source/drain regions defining a channel region therebetween. To store and erase data, the floating gate uses channel hot electrons for writing from the transistor's drain, and uses Fowler-Nordheim tunneling for erasure from the transistor's source.

An integrated circuit includes a large number of closely spaced semiconductor devices formed on a semiconductor substrate. Product development efforts in EEPROM device technology have focused on increasing the programming speed, lowering programming and reading voltages, increasing data retention time, reducing cell erasure times, and reducing cell dimensions. With the continuing miniaturization of integrated circuits, there is a relentless need to continually reduce the size of the memory array or, alternately, to increase the density of the memory array. A major goal in the semiconductor industry has been to reduce device size and spacing to achieve denser and denser packing, and to reduce the consumption of valuable space.

The density of the microelectronic devices on the semiconductor substrate may be increased by decreasing spacing between each of the various semiconductor devices. The decrease in spacing allows a larger number of such microelectronic devices to be formed on the semiconductor substrate. As a result, the computing power and speed of the semiconductor component may be greatly improved. The continuing reduction of design features, however, generates numerous problems challenging the limitations of conventional semiconductor technology.

One challenge in miniaturization is presented by the so-called "isolation structures" that are necessary to prevent each memory cell from interfering with the operation of its neighbors. Floating gate transistors are electrically isolated from one another by such isolation structures. One type of isolation structure that is used is a LOCal Oxidation of Silicon ("LOCOS") structure. LOCOS structures are generally formed by thermally growing a localized oxidation layer between the cells to electrically isolate the cells. One problem with the LOCOS structure is that the structure includes non-functional areas that waste valuable space on the semiconductor substrate, interfering with the need to achieve denser and denser packing.

Another type of isolation structure used is a Shallow Trench Isolation ("STI"). STI structures are generally formed by etching a trench between the cells and filling the trench with a suitable dielectric (insulating) material. STI structures are smaller than LOCOS structures and allow the memory cells to be spaced closer together to increase the density of cells in the array. However, STI structures are often not used in flash memory due to the difficulty in forming the source line that connects the cells in each row. The source line in flash memory utilizing STI structures often has a higher resistance than a corresponding flash memory that uses LOCOS structures. The increased electrical resistance reduces the operational performance of the memory.

Another miniaturization challenge has to do with how the various circuit elements are connected to each other in a semiconductor device. A flash EEPROM chip or die is commonly-formed with a plurality of flash EEPROM cells on a single substrate. Also typically included on the single chip or die substrate are peripheral circuit portions including input/output circuitry for selectively addressing the individual memory cells. During formation of the chip or die, steps are also performed to provide electrical connections or "contacts" for the memory cells. These steps are performed, following formation of the memory cells, to connect the memory cell gate structures, source regions, and drain regions to other parts of the chip. For miniaturization, it is desirable to dispose adjacent gate structures and their contacts as closely together as possible. Unfortunately, these interconnecting conductors must sometimes be positioned farther apart than desirable for the device elements to which they are connected.

Thus, there have been intensive efforts to discover ways, preferably using existing equipment and processes, to achieve improvements in reduced spacing and increased density between and within semiconductor devices. Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit structure. A semiconductor substrate is provided, and two trenches are formed in the semiconductor substrate to define an active region therebetween. An implanted source region is formed in one of the trenches on one side of the active region. An implanted drain region is formed in the other trench on the other side of the active region. Shallow trench isolations are then formed in the trenches. One or more gates are formed over the active region, and contacts to the implanted source region and the implanted drain region are formed. This method produces a flash memory device with smaller memory cells having more compact dimensions, resulting in the reduction of device size.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The term "horizontal" as used herein is defined as a plane parallel to the conventional plane or surface of a silicon wafer, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Typical prior art methods for fabricating non-volatile memory cells employ shallow trench isolations ("STI's") to define the device active area. The defining element of the non-volatile memory cell is the presence of a floating gate. A very thin tunneling oxide layer overlies the semiconductor substrate. The floating gate is formed overlying the tunneling dielectric and is comprised of a conductive material, such as doped polysilicon, that is not connected to any other circuit element.

A stack of dielectric material, called the interpoly dielectric, overlies the floating gate. The interpoly dielectric is typically composed of an oxide-nitride-oxide (O—N—O, or "ONO") stack comprising a bottom silicon dioxide layer, a silicon nitride layer, and a top silicon dioxide layer. In certain configurations, the ONO silicon nitride layer can be doped to serve as the charge-holding floating gate, allowing the tunneling oxide layer and the doped polysilicon layers to be omitted. Finally, a control gate of conducting material, such as polysilicon, overlies the second ONO silicon dioxide layer.

Figure 1A:
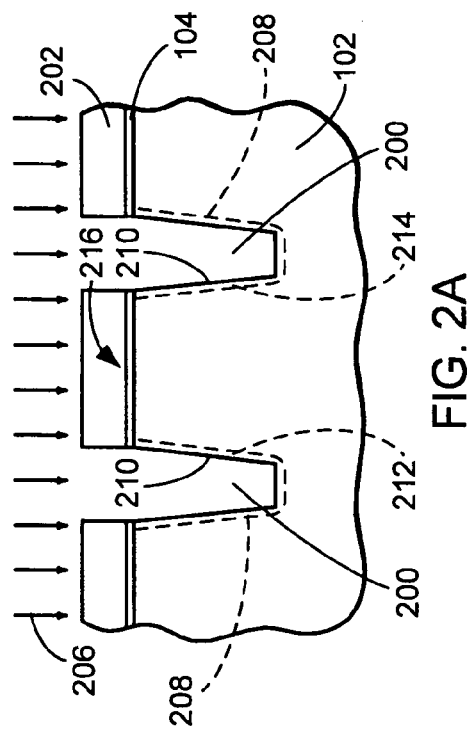
FIG. 1A is a cross-sectional view of a silicon wafer in the first stages of processing in accordance with the present invention.

Referring now to FIG. 1A, therein is shown a cross-section of a silicon wafer 100 in the first stages of processing to fabricate a non-volatile memory semiconductor device using STI trench implantation for the source and drain regions. The silicon wafer 100 has a semiconductor substrate 102, such as silicon ("Si"), on which a pad oxide layer 104 has been formed. The pad oxide layer 104, usually of silicon oxide ("SiO$_2$") has a first photomask 106 patterned and deposited thereover to define patterns of mask openings 108 for the subsequent formation of STI's.

Figure 1B:
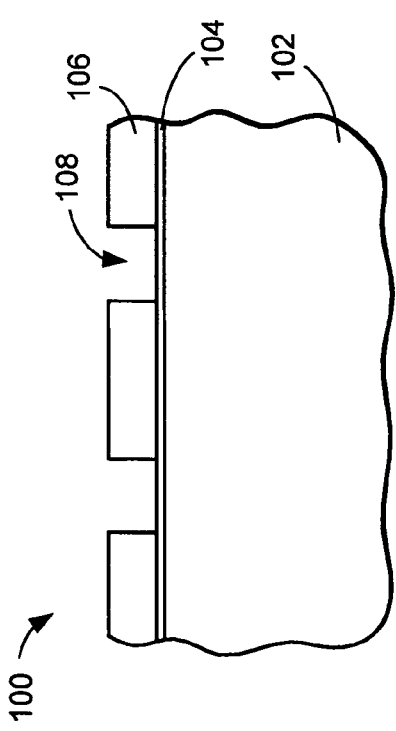
FIG. 1B a top plan view of a portion of the structure of FIG. 1A.

Referring now to FIG. 1B, therein is shown a fragmentary top plan view of the portion of the silicon wafer 100 illustrated in FIG. 1A.

Figure 2A:
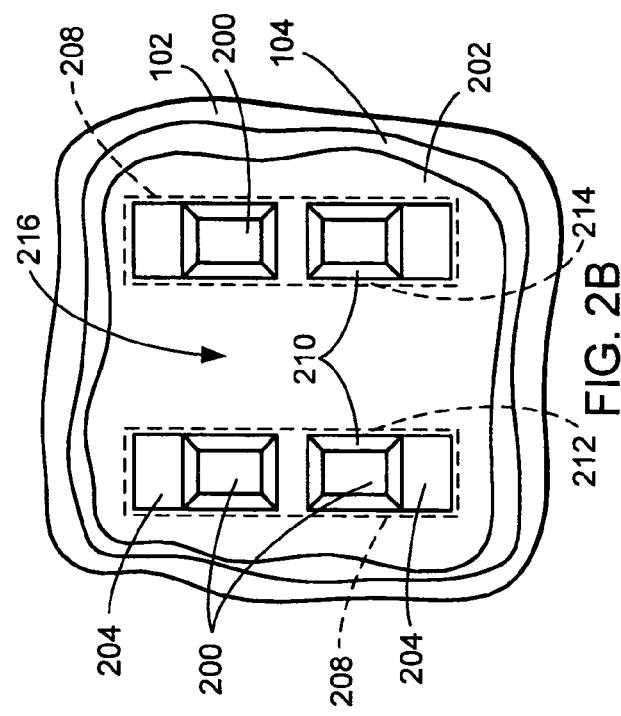
FIG. 2A is a cross-sectional view of the structure of FIG. 1A following etching of the pad oxide layer and the semiconductor substrate.

Referring now to FIG. 2A, therein is shown a cross-sectional view of the structure of FIG. 1A following etching of the pad oxide layer 104 and the semiconductor substrate 102 in those areas not protected by the first photomask 106 (FIG. 1A). As illustrated, the etching has formed trenches 200 into the semiconductor substrate 102, following which the first photomask 106 has been removed and a second photomask 202 has been patterned and deposited to define implantation mask openings 204.

Implantation arrows 206 illustrate implantation of conventional dopants, as appropriate, to create implanted areas 208 in the bases and the sidewalls 210 of the trenches 200. The implanted areas 208, as will be subsequently described, will serve as buried junctions. In particular, there is an implanted source region 212 and an implanted drain region 214 on the adjacent sidewalls 210 of adjacent trenches, the trenches defining therebetween the semiconductor device active region 216.

Figure 2B:
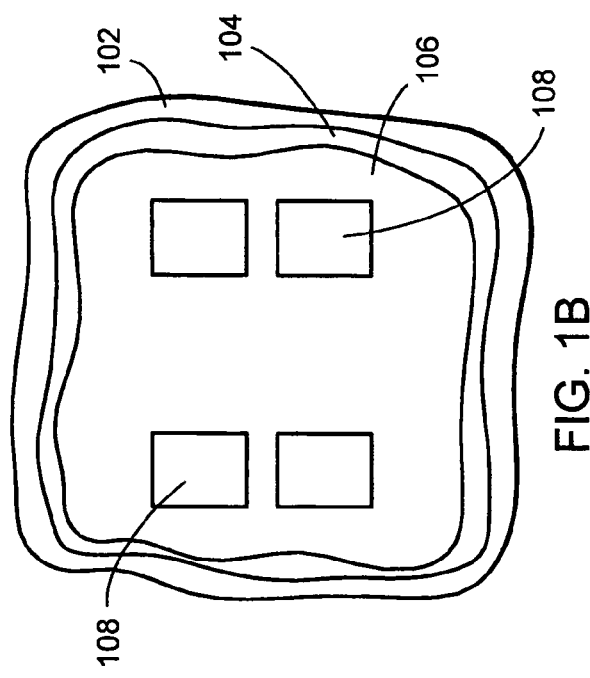
FIG. 2B is a top plan view of a portion of the structure of FIG. 2A.

Referring now to FIG. 2B, therein is shown a fragmentary top plan view of the portion of the silicon wafer 100 illustrated in FIG. 2A.

Figure 3A:
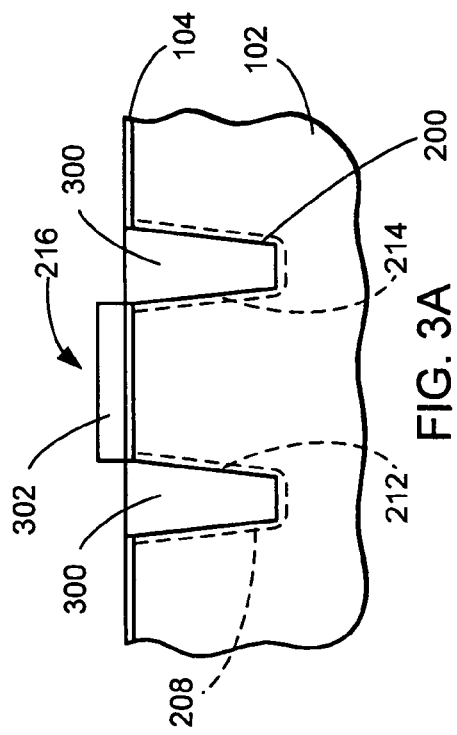
FIG. 3A is a cross-sectional view of the structure of FIG. 2A after shallow trench isolation and floating gate formation in accordance with the present invention.

Referring now to FIG. 3A, therein is shown a cross-sectional view of the structure of FIG. 2A after the trenches 200 have been filled with an STI material, such as SiO$_2$, and conventionally processed to form STI's 300 adjacent the implanted source region 212 and the implanted drain region 214, respectively. In this configuration, the STI's help to reduce the junction leakage.

A floating gate 302 has been formed in the active region 216 between the STI's 300.

Figure 3B:
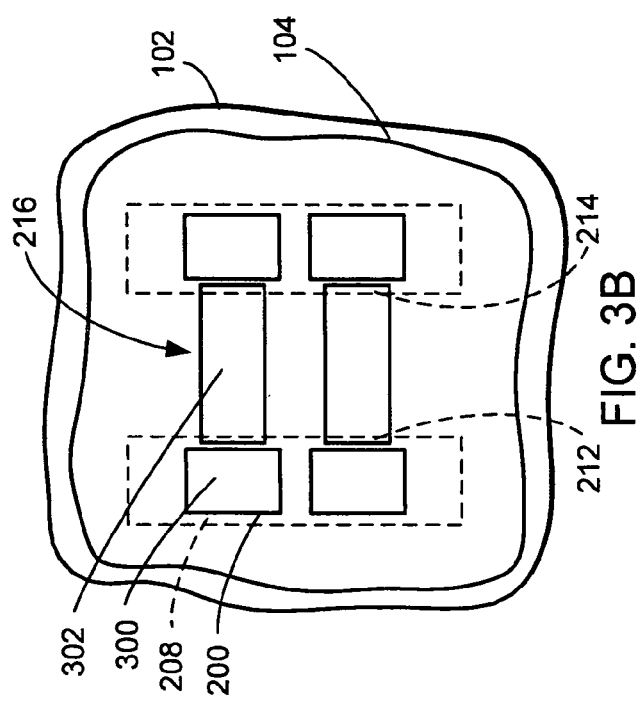
FIG. 3B is a top plan view of a portion of the structure of FIG. 3A.

Referring now to FIG. 3B, therein is shown a fragmentary top plan view of the portion of the silicon wafer 100 illustrated in FIG. 3A.

Figure 4A:
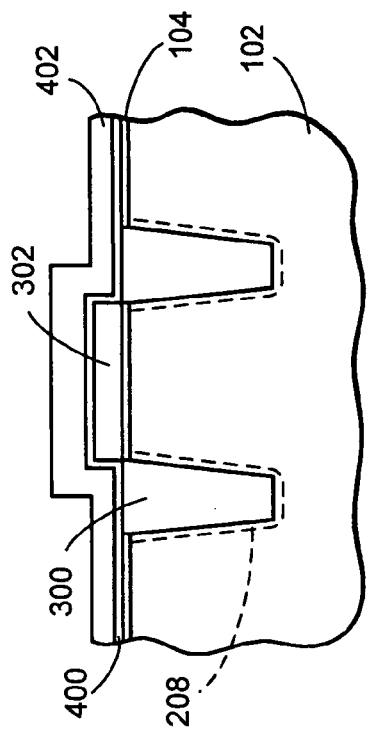
FIG. 4A is a cross-sectional view of the structure of FIG. 3A after formation of an interpoly dielectric layer and a control gate in accordance with the present invention.

Referring now to FIG. 4A, therein is shown a cross-sectional view of the structure of FIG. 3A after an interpoly dielectric layer 400 and a control gate 402 have been formed in conventional manner extending laterally across the STI's 300 and the floating gate 302 (cf. FIG. 4B), together forming the gate stack for the flash cells which are being formed on the semiconductor substrate 102.

Figure 4B:
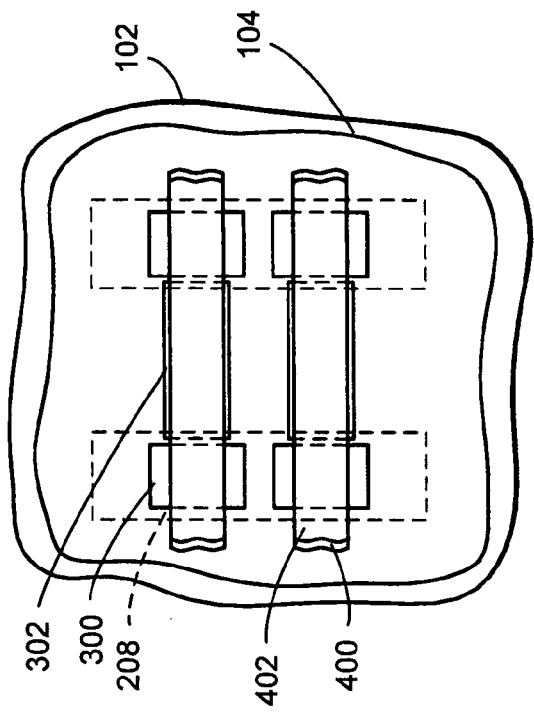
FIG. 4B is a top plan view of a portion of the structure of FIG. 4A.

Referring now to FIG. 4B, therein is shown a fragmentary top plan view of the portion of the silicon wafer 100 illustrated in FIG. 4A.

Figure 5A:
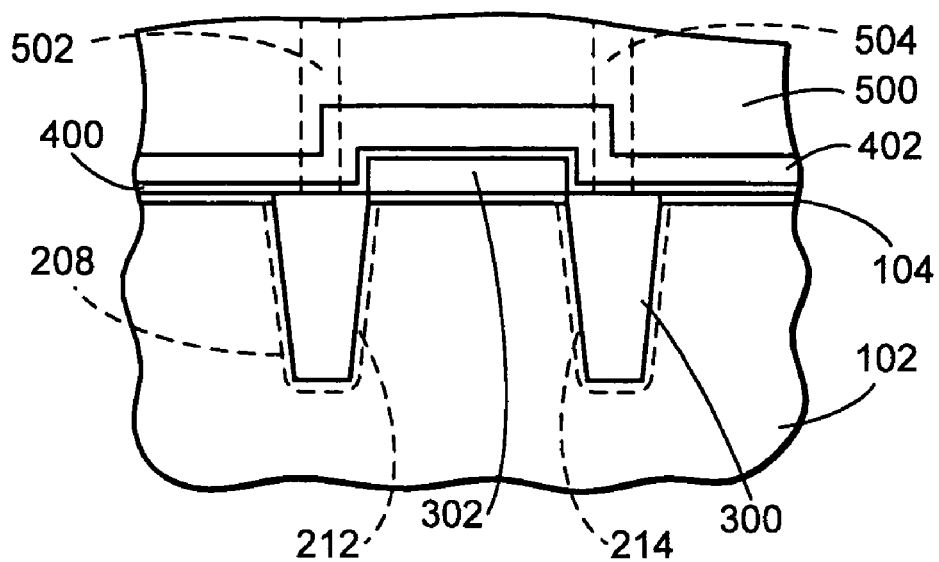
FIG. 5A is a cross-sectional view of the structure of FIG. 4A following formation of a device dielectric layer and contacts over and to the various layers and selected elements on the semiconductor substrate.

Referring now to FIG. 5A, therein is shown a cross-sectional view of the structure of FIG. 4A after a device dielectric layer 500 has been formed over the various layers on the semiconductor substrate 102. A source contact 502 and a drain contact 504 are also shown, formed in conventional manner through the device dielectric layer 500 and the STI's 300 to connect electrically, respectively, to the implanted source region 212 and the implanted drain region 214.

As is conventionally known, the source contact 502 and the drain contact 504 (as well as other characteristic contacts, not shown) are formed to enable electrical connection of selected components of the discrete memory cells to other parts of the chip. In particular, the source contact 502 is formed to connect to the implanted source region 212, the drain contact 504 is formed to connect to the implanted drain region 214, and an electrical contact (not shown) is made to connect to the control gate 402 of the stacked gate structure of the memory cell.

In a typical process (not shown) for forming these electrical contacts, suitable etch stop, dielectric, and photoresist layers are formed in conventional fashion over the semiconductor substrate 102 and the various layers thereon, including the memory cell regions. The photoresist is photolithographically processed to form a pattern of contact openings. An anisotropic etch is used to form openings in the device dielectric layer 500 and the STI's 300 for the source contact 502 and the drain contact 504, among others.

The contact openings for the source contact 502 and the drain contact 504 stop at the implanted source region 212 and the implanted drain region 214 in the semiconductor substrate 102. The photoresist is then stripped and a conductive material, such as tungsten, is deposited over the device dielectric layer 500 and fills the contact openings to form so-called "self-aligned" conductive contacts. The substrate is then subjected to a chemical-mechanical planarization ("CMP") process, which removes the conductive material above the device dielectric layer 500, completing formation of the contacts, including the source contact 502 and the drain contact 504, as shown.

Figure 5B:
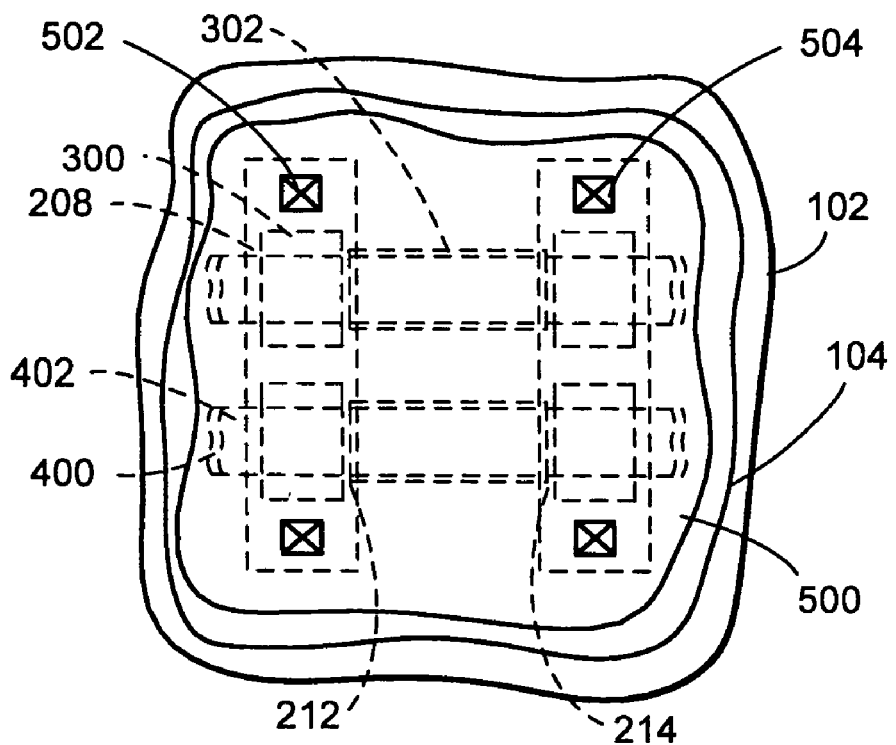
FIG. 5B is a top plan view of a portion of the structure of FIG. 5A.

Referring now to FIG. 5B, therein is shown a fragmentary top plan view of the portion of the silicon wafer 100 illustrated in FIG. 5A.

Figure 6:
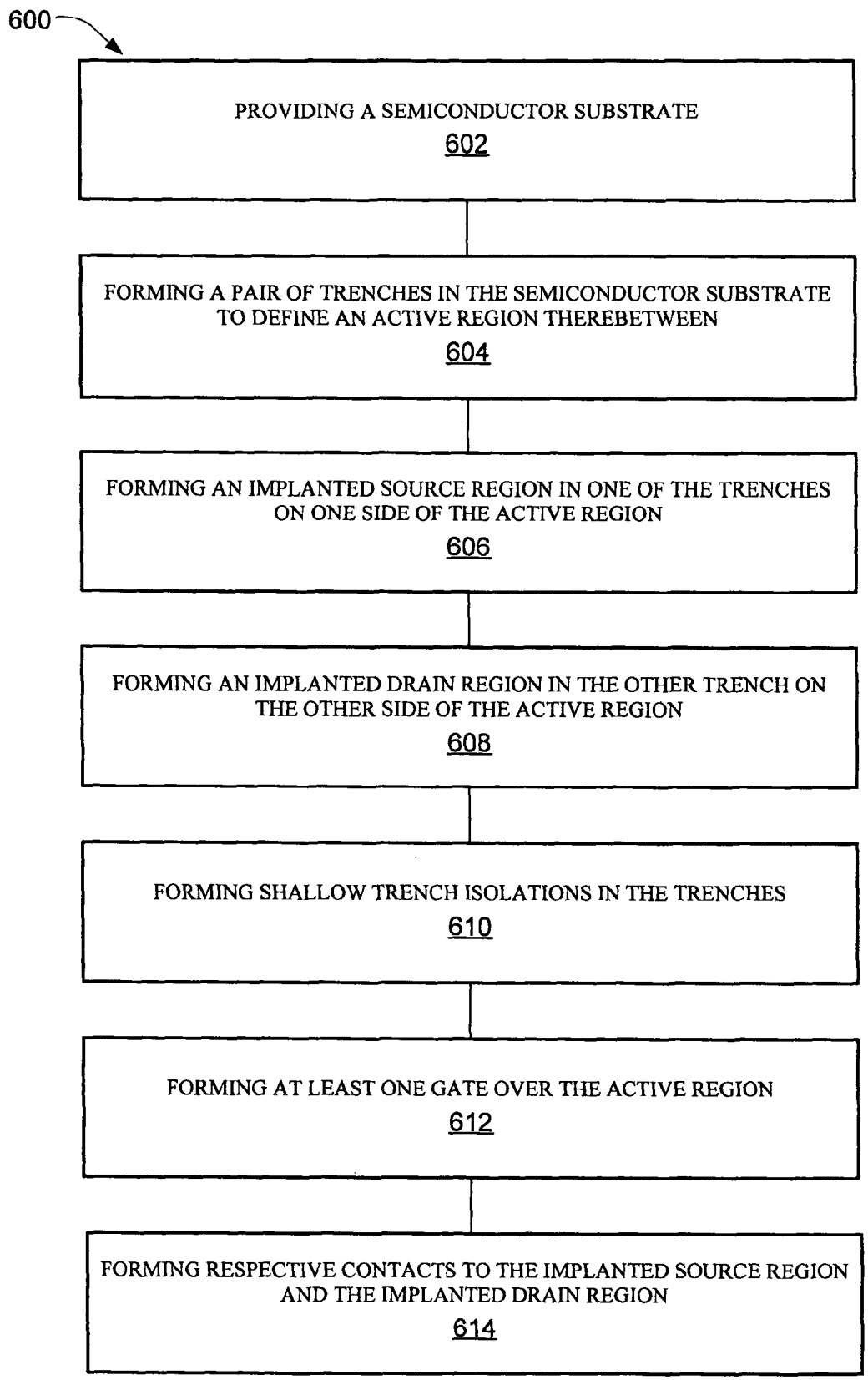
FIG. 6 is a flow chart of a method for providing non-volatile memory using shallow trench isolation trench implantation in accordance with the present invention.

Referring now to FIG. 6, therein is shown a flow chart of a method 600 for providing non-volatile memory using STI trench implantation in accordance with the present invention. The method includes a step 602 of providing a semiconductor substrate; a step 604 of forming a pair of trenches in the semiconductor substrate to define an active region therebetween; a step 606 of forming an implanted source region in one of the trenches on one side of the active region; a step 608 of forming an implanted drain region in the other trench on the other side of the active region; a step 610 of forming shallow trench isolations in the trenches; a step 612 of forming at least one gate over the active region; and a step 614 of forming respective contacts to the implanted source region and the implanted drain region.

In greater detail, a manufacturing method to produce the non-volatile memory using STI trench implantation is performed as follows:

1. The semiconductor substrate 102 is suitably prepared and the pad oxide layer 104 of $SiO_2$ is formed thereon. The first photomask 106 is patterned and formed over the pad oxide layer 104, the first photomask 106 having the mask openings 108 formed therein for the STI's 300. (FIGS. 1A and 1B)
2. The pad oxide layer 104 and the semiconductor substrate 102 are etched through the mask openings 108 to form the trenches 200. The walls and bases of the trenches 200 are then implanted, forming the implanted areas 208. On one side of the active region 216 the implanted area forms the implanted source region 212, and the opposing implanted region in the opposite trench 200 forms the implanted drain region 214. The implanted areas 208 form buried junctions. (FIGS. 2A and 2B)
3. The STI's 300 are formed in the trenches 200. The floating gate 302 is then formed in the active region 216 between the STI's 300. (FIGS. 3A and 3B)
4. The interpoly dielectric layer 400 is formed extending across the STI's 300 and the floating gate 302. The control gate 402 is then formed over the interpoly dielectric layer 400. (FIGS. 4A and 4B)
5. The device dielectric layer 500 is formed over the various layers on the semiconductor substrate 102, and the contacts, including the source contact 502 and the drain contact 504, are formed through the device dielectric layer 500 to the implanted source region 212 and the implanted drain region 214, respectively. (FIGS. 5A and 5B)

The final structure is completed with conventional finishing steps, to produce a flash memory device in which the individual memory cells have smaller, more compact dimensions than conventional flash memory cells. The smaller, more compact dimensions are due to the vertically configured source and drain regions on the edges of the STI's. Additional savings of space and reduction of device size are afforded by locating the source and drain contacts over the STI's, rather than over horizontally extending source and drain regions disposed laterally to the sides.

Accordingly, it has been discovered that the present invention has numerous advantages. Principle among these is the reduction in memory cell size, along with the economies and cost savings afforded through the use of existing manufacturing techniques and equipment. Additionally, the present invention is well suited to further size reduction by eliminating the conventional selection devices ordinarily in series with the memory devices. This can be done by using a bit line page programming technique in which the drains of all single transistor memory cells in a column are connected to a bit line, the control gates of all single transistor memory cells in a row are connected to a word line, and the sources of all memory cells in each sector are connected to a sector select line. The optimized memory array layout according to this technique requires only one contact opening for the metal bit line interconnection shared by two adjacent memory cells, so that the area required for the contact opening occupies much less than the total memory cell area.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method for manufacturing an integrated circuit structure, comprising:

providing a semiconductor substrate;

forming a pair of trenches in the semiconductor substrate to define an active region therebetween;

forming an implanted source region in one of the trenches on one side of the active region;

forming an opposing implanted drain region in the other trench on the other side of the active region opposite the implanted source region in the one trench;

forming shallow trench isolations in the trenches;

forming at least one gate extending laterally across the active region and the implanted source and drain regions; and forming respective contacts to the implanted source region and the implanted drain region.

2. The method of claim 1 wherein the at least one gate is a floating gate, and further comprising forming an interpoly dielectric layer over at least portions of the shallow trench isolations, the implanted source and drain regions, and the floating gate.

3. The method of claim 2 further comprising forming a control gate over the interpoly dielectric layer.

4. The method of claim 1 further comprising forming a device dielectric layer over at least the shallow trench isolations and gate.

5. The method of claim 4 wherein the step of forming respective contacts to the implanted source region and the implanted drain region further comprises forming the respective source and drain contacts through the device dielectric layer to the implanted source region and the implanted drain region.

6. A method for manufacturing a flash memory integrated circuit structure, comprising:

providing a semiconductor substrate;

forming a pad oxide layer on the semiconductor substrate;

patterning and forming a first photomask on the pad oxide layer, the first photomask having mask openings therein for forming shallow trench isolation trenches;

forming shallow trench isolation trenches in the semiconductor substrate;

implanting buried junctions in the trenches, the implanted area of one such buried junction in one such trench, along the sidewall thereof adjacent another such trench, forming an implanted source region, the implanted area of the buried junction along the opposing sidewall of the other such trench opposite the implanted source region in the one such trench and adjacent the implanted source region forming an implanted drain region, and the portion of the semiconductor substrate between the implanted source region and the implanted drain region forming an active region for the integrated circuit structure;

forming shallow trench isolations in the trenches;

forming a floating gate over the active region between the implanted source and the implanted drain regions; and forming at least one gate extending laterally across the active region and the implanted source and drain regions.

7. The method of claim 6 further comprising forming an interpoly dielectric layer over at least portions of the shallow trench isolations, the buried junctions, and the floating gate.

8. The method of claim 7 further comprising forming a control gate over the interpoly dielectric layer.

9. The method of claim 6 further comprising forming a device dielectric layer over at least the shallow trench isolations and floating gate.

10. The method of claim 9 further comprising forming source and drain contacts through the device dielectric layer to the implanted source region and the implanted drain region, respectively.

* * * * *